United States Patent [19]

Wu et al.

[11] Patent Number: 5,801,090
[45] Date of Patent: Sep. 1, 1998

[54] METHOD OF PROTECTING AN ALIGNMENT MARK IN A SEMICONDUCTOR MANUFACTURING PROCESS WITH CMP

[75] Inventors: Lin-June Wu; Jau-Jey Wang, both of Hsinchu, Taiwan

[73] Assignee: Taiwan Semiconductor Manufacturing Co., Ltd., Hsinchu, Taiwan

[21] Appl. No.: 845,608

[22] Filed: Apr. 25, 1997

[51] Int. Cl.⁶ .................................................. H01L 21/28
[52] U.S. Cl. ........................... 438/622; 438/631; 438/633; 438/975
[58] Field of Search ........................... 438/401, 622, 438/631, 633, 975, 706, 745; 148/DIG. 102

[56] References Cited

U.S. PATENT DOCUMENTS

| | | | |
|---|---|---|---|
| 4,936,930 | 6/1990 | Gruber et al. | 438/975 |
| 5,401,691 | 3/1995 | Caldwell | 438/633 |
| 5,503,962 | 4/1996 | Caldwell | 430/317 |
| 5,627,110 | 5/1997 | Lee et al. | 438/692 |

*Primary Examiner*—T. N. Quach
*Attorney, Agent, or Firm*—Christensen, O'Connor, Johnson & Kindness PLLC

[57] ABSTRACT

The present invention is a method of protecting an alignment mark in semiconductor manufacturing process with CMP. This invention utilizes a via mask or masking blade to remove the intermetal dielectric layer on a wide clear-out window using two etching steps. One etching step is performed before intermetal dielectric layer polish. The other etching step is performed after intermetal dielectric layer polish. Thus, there is no intermetal dielectric layer remained on the alignment mark and the alignment mark keeps the original shape.

20 Claims, 12 Drawing Sheets

METHOD OF PROTECTING AN ALIGNMENT MARK IN A SEMICONDUCTOR MANUFACTURING PROCESS WITH CMP

FIELD OF THE INVENTION

The present invention relates to semiconductor manufacturing processes and, more particularly, to methods of protecting an alignment mark in semiconductor manufacturing processes with chemical mechanical polishing (CMP).

BACKGROUND

Some conventional integrated circuit (IC) fabrication processes that do not use a CMP process use a wide clear-out window (WCW) process to align a reticle with a wafer when exposing a photoresist layer. FIGS. 1–7 are cross sectional views of the alignment mark area of a semiconductor wafer illustrating such a conventional process. It will be appreciated by those skilled in the art of IC fabrication that the wafer has many IC areas (not shown) in and on which IC structures are fabricated. FIG. 1 shows an initial stage of this conventional process. A polysilicon layer 1.2 is formed on a substrate 10 that includes a WCW area (indicated by the arrows 11) having alignment marks 11A thereon. A first dielectric layer 14 is then formed on the polysilicon layer 12, which serves as an interlayer dielectric (ILD) layer. A patterned photoresist layer 16 is then formed on the first dielectric layer 14 in the conventional manner to define the WCW area. The reticle for defining the contact windows in the IC areas (not shown) of the wafer is typically also used in this step to define the WCW area. Then an etching step is performed to remove portions of the first dielectric layer 14 not covered by the patterned photoresist layer 16, thereby forming contact holes (not shown) in the IC area and the WCW area of the alignment mark area. The photoresist layer 16 is then removed in the conventional manner, resulting in the structure shown in FIG. 2.

Referring to FIG. 3, a first metal layer 18 is formed on the first dielectric layer 14 and the polysilicon layer 12. Typically, a metal layer covered on the alignment marks can duplicate the sharp of the alignment marks. The first metal layer 18 is typically deposited by sputtering a metal such as aluminum. The first metal layer 18 can also be deposited by using a chemical vapor deposition (CVD) process. A second dielectric layer 20 is then formed on the first metal layer 18 to serve as an intermetal dielectric (IMD) layer. The second dielectric layer 20 is commonly an oxide layer. Turning to FIG. 4, the second dielectric layer 20 is then masked by a patterned photoresist layer 21 to again define the WCW area in the alignment mark area. Although the alignment marks 11 A is covered by the metal layer 18, the metal layer 18 can duplicate the sharp of the alignment marks. Thus, the photoresist mark 21 is aligned. The photoresist layer 21 is also used to define vias in the IC areas (not shown) of the wafer (i.e., in the first IMD layer). Then an etching step (indicated by arrows 21 A) is performed to remove portions of the second dielectric layer 20 not covered by the patterned photoresist layer 21. The photoresist layer 21 is then removed, resulting in the structure shown in FIG. 5.

FIG. 6 shows a next stage of this conventional method. The steps illustrated in FIGS. 4 and 5 are essentially repeated during the formation of a next higher set of via structures in the IC areas (not shown). That is, a second metal layer 22 is formed on the second dielectric layer 20 and the first metal layer 18. A third dielectric layer 24 is then formed on the second metal layer 22 to serve as a second IMD layer. A patterned photoresist layer (not shown) is then formed on the third dielectric layer 24. Then an etching step is performed to remove portions of the third dielectric layer 24 not covered by the patterned photoresist layer 20, forming the WCW in the alignment mark area and a set of via holes in the second IMD layer (not shown). After this etching step and removal of the photoresist, a third metal layer 26 is formed on the third dielectric layer 24 and the second metal layer 22. The resulting structure is shown in FIG. 7. However, this process is not well suited for IC fabrication processes using CMP. CMP is often used in IC fabrication to planarize intermediate dielectric layers to improve the accuracy of subsequent photolithographic processes. Because the CMP is a global planarization technique, the CMP step(s) will also planarize the dielectric layers in the alignment mark area. In conventional method, an oxide on alignment marks is removed along with an contact/via etching process.

FIGS. 8–21 are cross sectional views of the alignment mark area of a semiconductor wafer illustrating a conventional process for forming alignment marks in IC fabrication processes that use CMP. FIG. 9 shows an initial stage of this conventional process. A substrate 30 is provided having alignment marks (indicated by the arrows 31A) thereon. The substrate 30 also has a WCW area (indicated by the arrows 31). A polysilicon layer 32 is then formed on the substrate 30. A photoresist mask is then formed to pattern and etch the polysilicon layer 32 so that the polysilicon layer 32 covers the alignment marks 31A but not the entire WCW area. A first dielectric layer 34 is then formed on the polysilicon layer 32 and the substrate 30 to serve as an ILD layer. Next, a patterned photoresist layer 35 is formed on the first dielectric layer 34 to define the WCW area. This photoresist step is typically combined with the photoresist step for defining the contact windows in the IC areas (not shown) of the wafer. Then an etching step is performed to remove the first dielectric layer 34 not covered by the patterned photoresist layer 35 to form contact holes in the IC areas and the WCW area in the alignment mark area. The resulting structure is shown in FIG. 9.

Referring to FIG. 10, a first metal layer 36 is deposited on the first dielectric layer 34 and the polysilicon layer 32. Then, a patterned photoresist layer 37 is formed on the first metal layer 36 as shown in Figure 11 using the same alignment mark area reticle used to pattern the photoresist layer to etch the polysilicon layer 32 (see FIG. 8). The alignment marks in polysilicon layer 32 will be replicated to metal layer 36. This photoresist step is combined with the photoresist step for defining the first metal layer over the IC areas (not shown). An etching step is then performed to form interconnect lines in the IC areas (not shown) and, in the alignment mark area, to remove portions of the first metal layer 36 not covered by the patterned photoresist layer 37. As a result, the first metal layer 36 and the polysilicon layer 32 form a stacked structure in the WCW area, as shown in FIG. 12.

Referring to FIG. 13, a second dielectric layer 38 is deposited to serve as a first IMD layer. Turning to FIG. 14, a CMP process is then performed to planarize the second dielectric layer 38. Next, a photoresist mask 39 is formed on the dielectric layer 38 as shown in FIG. 15. The photoresist mask 39 is formed using the alignment mark area reticle defining the WCW area. This photoresist step is typically combined with the photoresist step for forming the vias in the IMD layer over the IC areas (not shown) of the wafer. Then an etching step is performed to remove portions of the second dielectric layer 38 not covered by the patterned photoresist layer 39. The resulting structure is shown in FIG. 16.

FIG. 17 shows a next stage of this conventional method. A second metal layer 40 is deposited on the second dielectric layer 38 and the first metal layer 36. Then, a patterned photoresist layer 42 is formed on the second metal layer 40, defining the WCW area. This photoresist step is typically combined with the photoresist step for defining the second metal layer interconnect in over the aforementioned IC areas of the wafer. An etching step is performed to remove portions of the second metal layer 40 not covered by the patterned photoresist layer 42, thereby forming a stacked structure in the WCW area from the second metal layer 40, the first metal layer 36 and the polysilicon layer 32.

Referring to FIG. 18, a third dielectric layer 44 is then deposited to form the second IMD layer. Then a CMP process is performed to planarize the third dielectric layer 44. Then, as shown in FIG. 19, a patterned photoresist layer 45 is formed on the third dielectric layer 44, defining the WCW area. This photoresist step is typically combined with the photoresist step to form vias in the second IMD layer over the aforementioned IC areas of the wafer. Then, a dry etching step is performed to remove portions of the third dielectric layer 44 not covered by the patterned photoresist layer 45. The resulting structure is shown in FIG. 20. Finally, a third metal layer 46 is formed on the third dielectric layer 44 and the second metal layer 40, as shown in FIG. 21. The third metal layer 46 is then later patterned and etched to form the third metal layer interconnect for the aforementioned IC areas of the wafer.

Although this method can be used with IC fabrication processes that have CMP steps, this method has several disadvantages. For example, an additional mask is needed for defining the polysilicon layer and metal layers in the WCW area. In addition, the stacked structure of the polysilicon layer and metal layer becomes thicker as the number of metal layers is increased. This increased thickness makes the alignment marks vague, especially if extended to a five-layer metal process. Further, because the CMP process is relatively difficult to precisely control, the alignment marks may be damaged if the thickness of the ILD and/or IMD layers is at the lower limit after polishing.. Still further, if the ILD and/or IMD layers have a thickness after polish at the higher limit, alignment fail may occur in the subsequent metal photoresist step. Therefore, there is a need for a method of fabricating alignment marks that protects the alignment marks during CMP processing.

SUMMARY

In accordance with the present invention, a method is provided for protecting alignment marks in semiconductor multi-metal layer IC manufacturing processes that use CMP to planarize an IMD layer. In one embodiment, the method includes forming a WCW area before forming a metal layer and the IMD layer. Then, a WCW photoresist layer is formed on the IMD layer, which can be then isotropically etched. This isotropic etching step is used to reduce IMD layer thickness atop alignment mark. Then the IMD layer is planarized using a CMP process. After this polishing step, the WCW photoresist layer is again formed. The IMD layer is then etched to expose the metal layer within the WCW area, and the photoresist layer is then removed. This process is then repeated for formation of subsequent IMD and metal layers. As a result, all of the metal layers remain on the alignment marks, unlike in the aforementioned conventional process. Further, unlike the aforementioned conventional process, no extra mask is needed. In addition, the alignment marks are not damaged because the step height in WCW area by this method is not so severe as that by conuentional approach. Still further, this process can be directly extended to five-layer metal processes and beyond.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
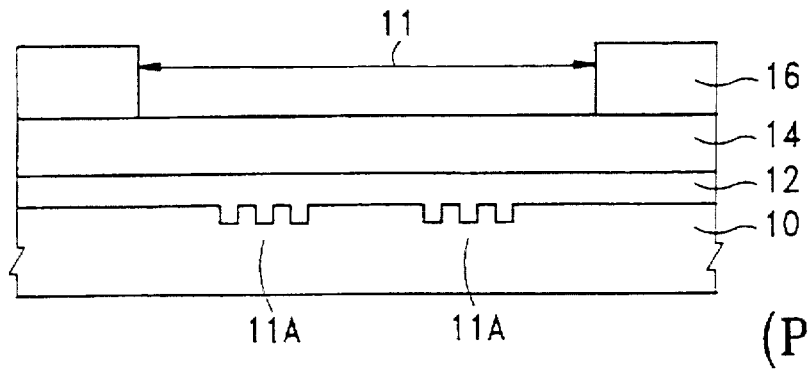
FIGS. 1–7 are cross sectional views of the alignment mark area of a semiconductor wafer illustrating a conventional process for fabricating a multi-metal layer IC without CMP.
Figure 2:
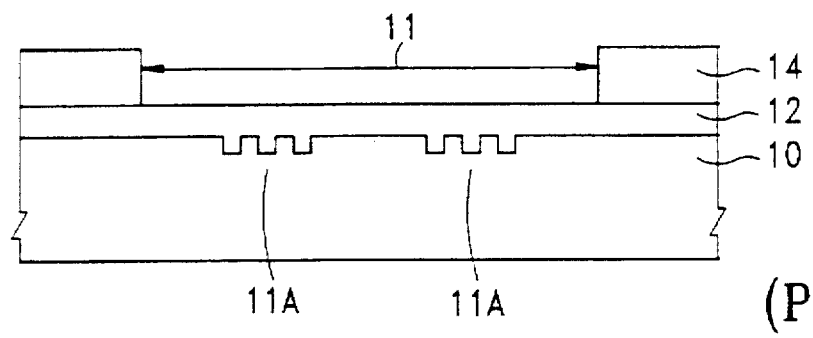
Figure 3:
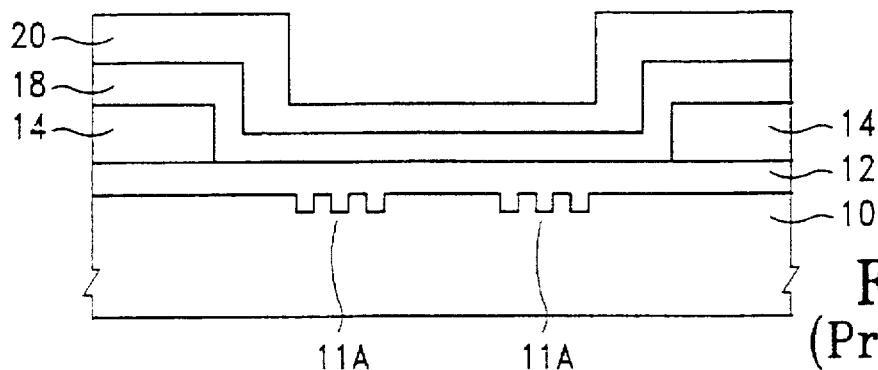
Figure 4:
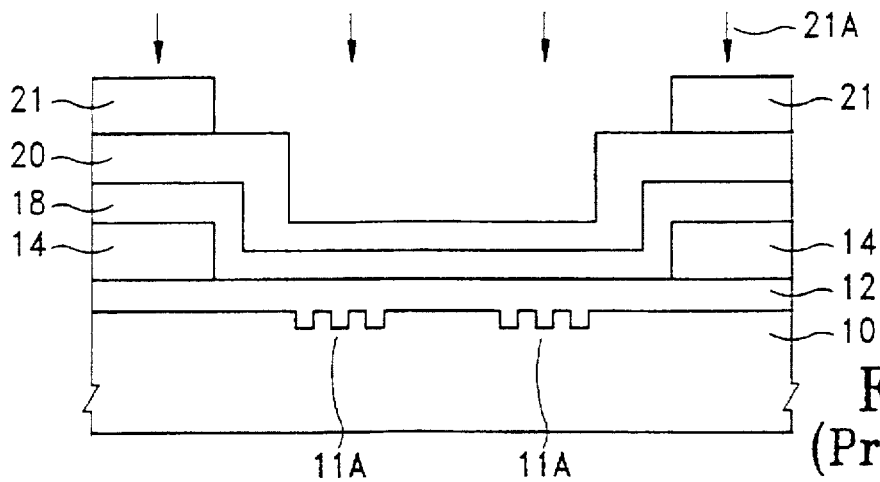
Figure 5:
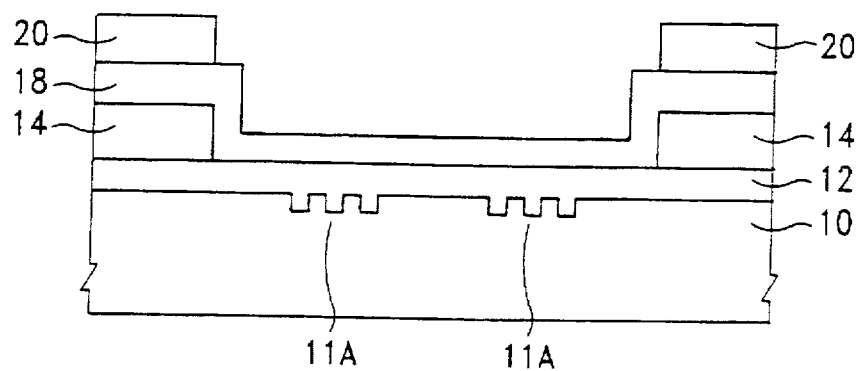
Figure 6:
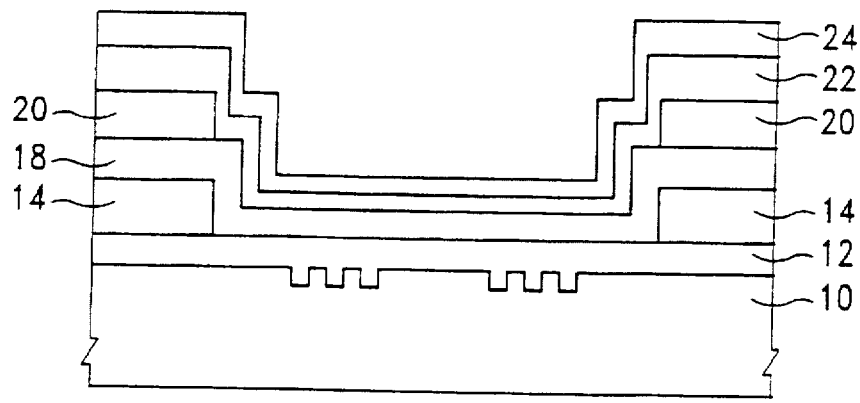
Figure 7:
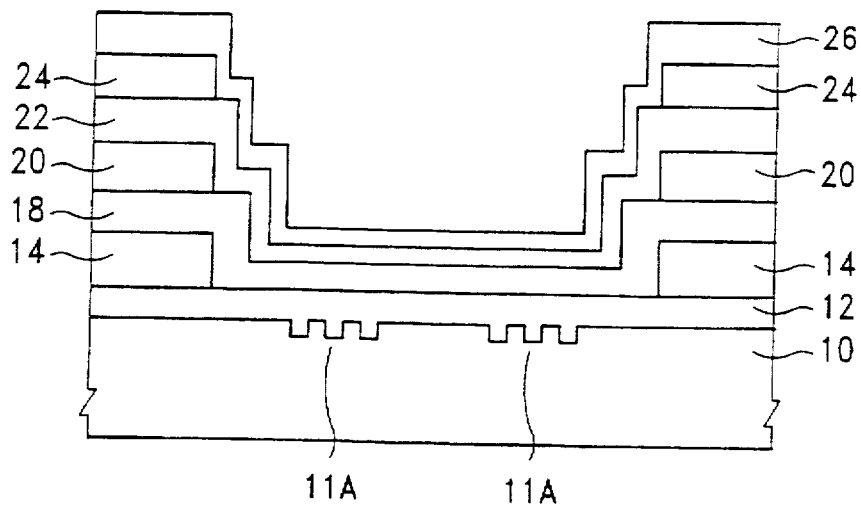
Figure 8:
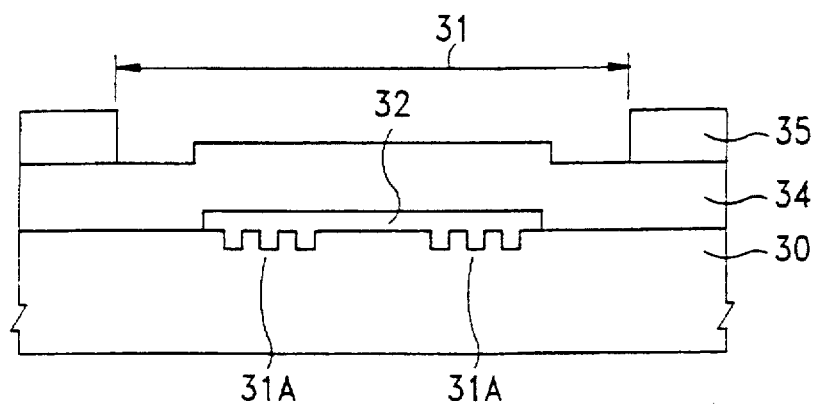
FIGS. 8–21 are cross sectional views of the alignment mark area of a semiconductor wafer illustrating a conventional process for fabricating a multi-metal layer IC with CMP.
Figure 9:
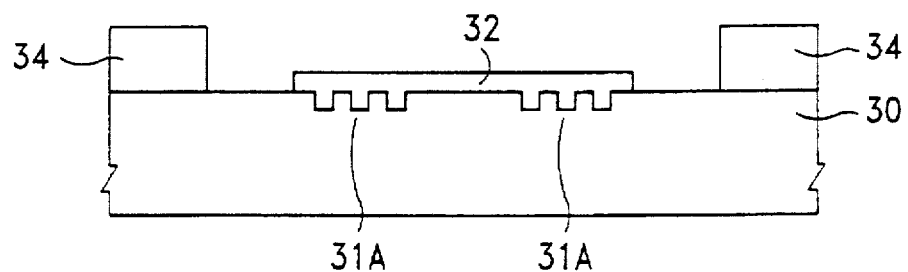
Figure 10:
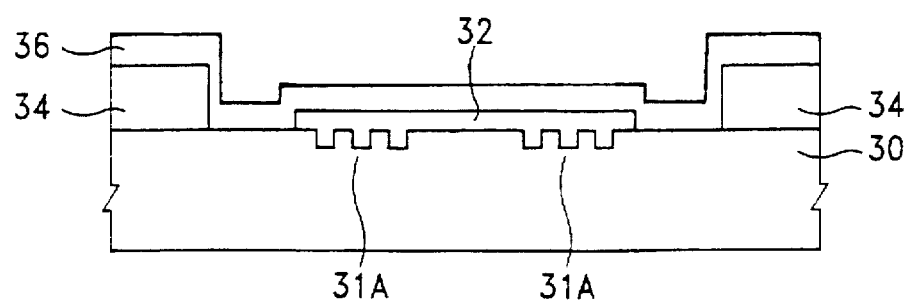
Figure 11:
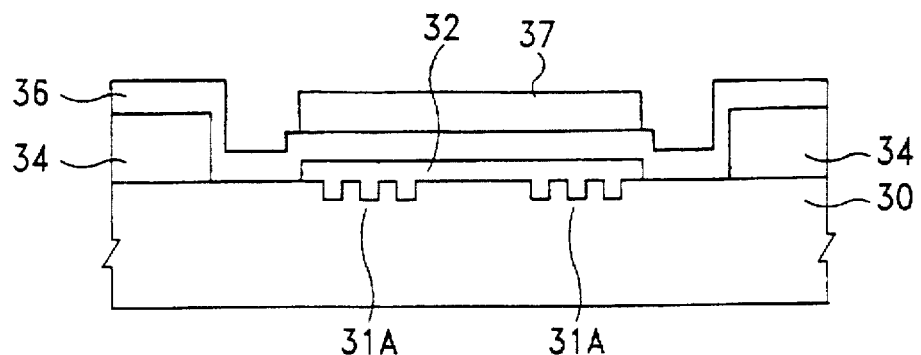
Figure 12:
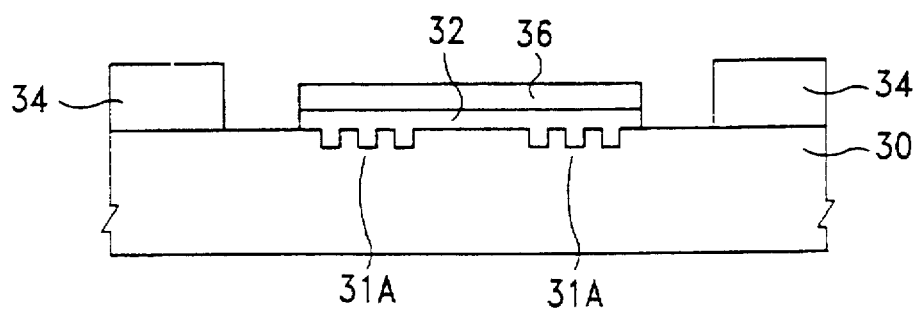
Figure 13:
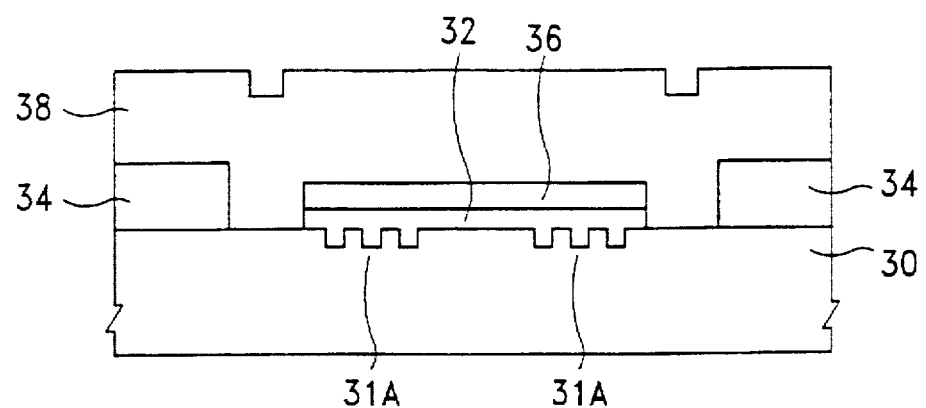
Figure 14:
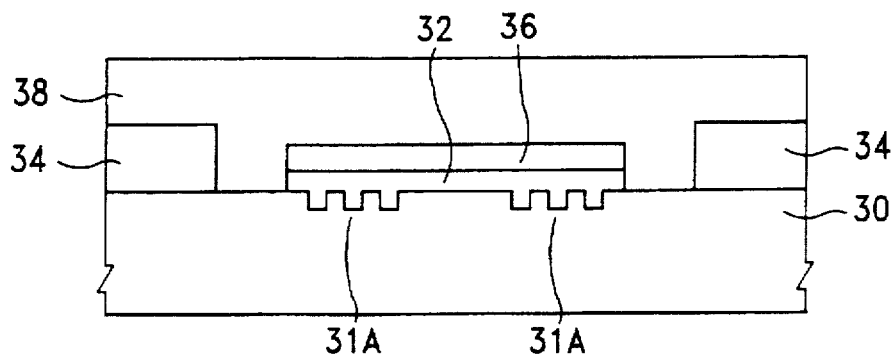
Figure 15:
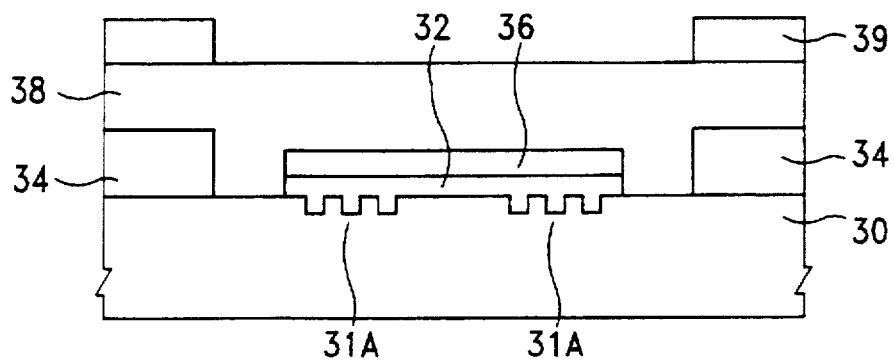
Figure 16:
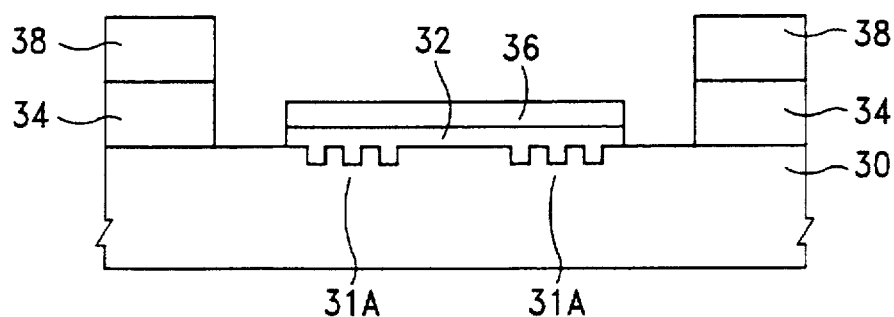
Figure 17:
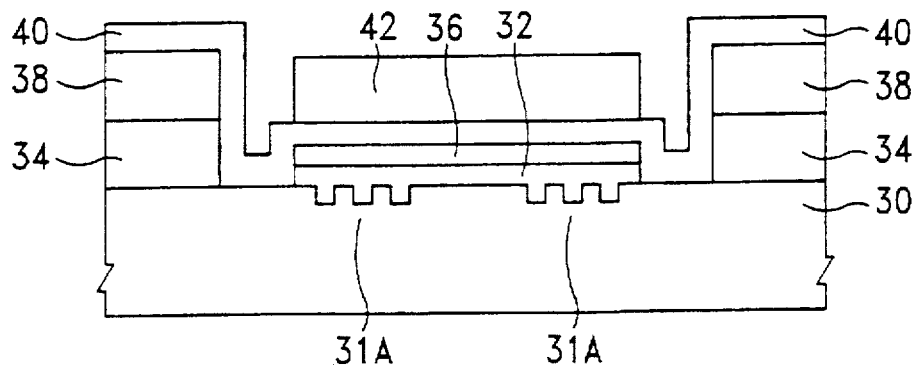
Figure 18:
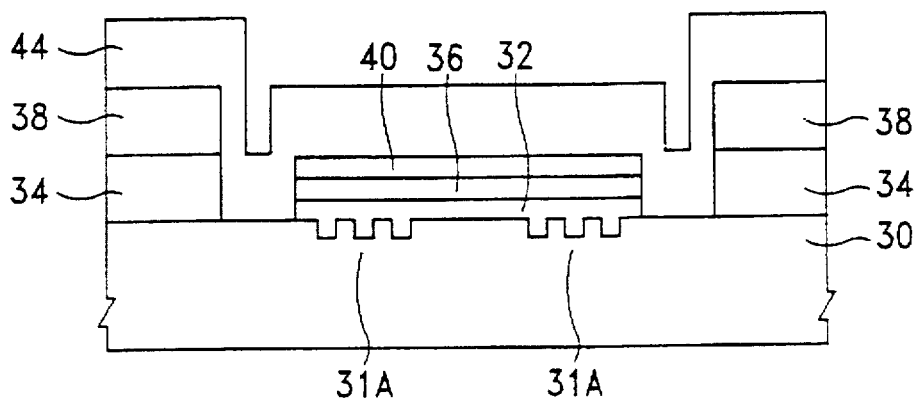
Figure 19:
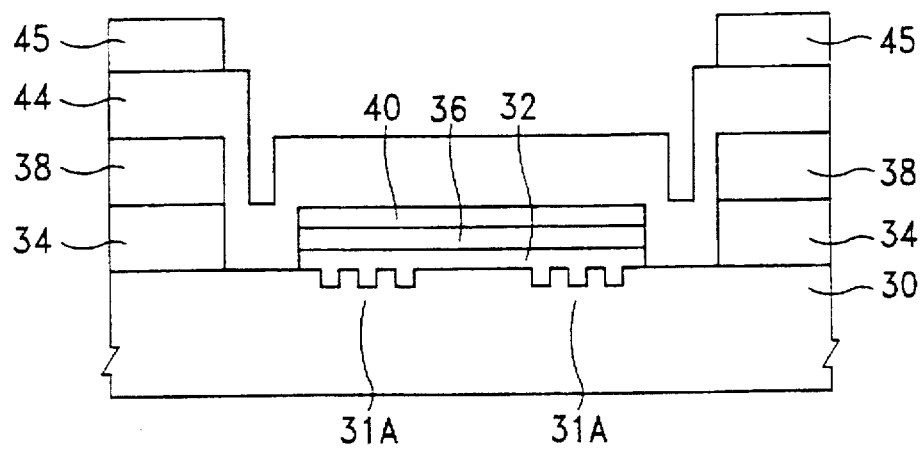
Figure 20:
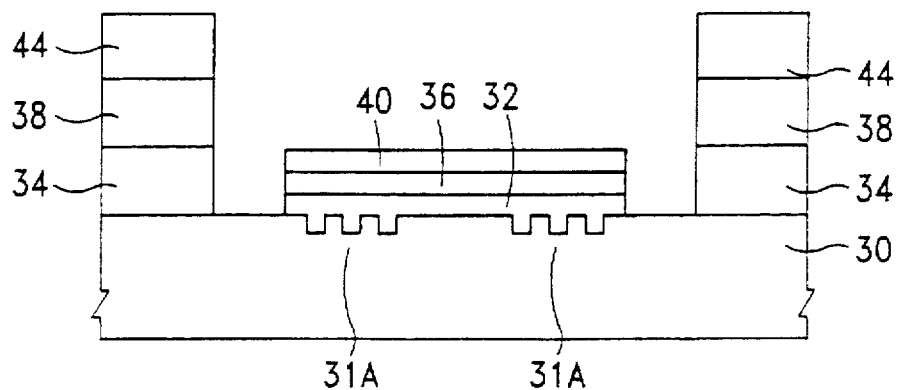
Figure 21:
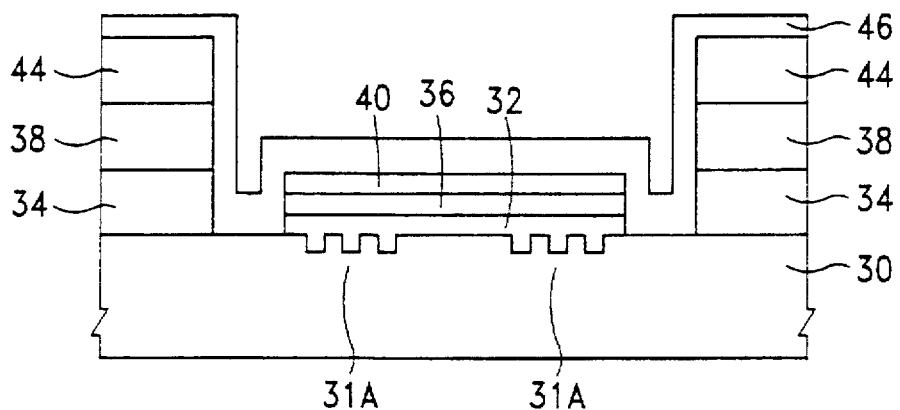
Figure 22:
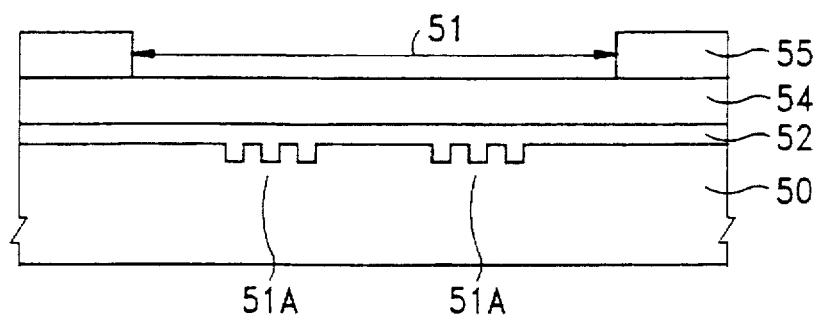
FIGS. 22–37 are cross sectional views of the alignment mark area of a semiconductor wafer illustrating various stages of protecting an alignment mark during the fabrication of a multi-metal layer IC, according to one embodiment of the present invention.

The method for protecting alignment marks in semiconductor manufacturing processes with CMP described herein includes some process procedures that are well known in the art of semiconductor IC fabrication and, thus, need not be described in detail. For example, the various photolithographic and etching process for patterning a layer are very well known and, therefore, the various steps of these processes are omitted. FIG. 22 shows an initial stage of one embodiment of the present invention. More specifically, FIG. 22 shows the alignment mark area of a semiconductor wafer. It will be understood by those skilled in the art of IC fabrication that the wafer contains a relatively large number of IC areas (not shown). The present invention is directed to the stages of IC fabrication processes in which multiple metal layers and CMP-planarized IMD layers are used to form metal interconnect structures on the IC areas of the wafer.

The wafer includes a semiconductor substrate 50 having alignment marks 51A formed thereon. The alignment marks are formed using any suitable standard process. A polysilicon layer 32 is then formed on the substrate 50 using any suitable conventional process. In this embodiment, the polysilicon layer 52 can deposited by using a conventional chemical vapor deposition (CVD) process to a thickness of about 1000 to 3000 angstroms. A first dielectric layer 54 is then formed on the polysilicon layer 52. In this embodiment, the first dielectric layer 54 serves as an ILD layer. The first dielectric layer 54 can be formed from any suitable dielectric material such as borophosphosilicate glass (BPSG) or tetraethylorthosilicate (TEOS) oxide. The first dielectric layer 54 is deposited to a thickness having a range of about 5000 to 15000 angstroms using any suitable standard process.

Figure 23:
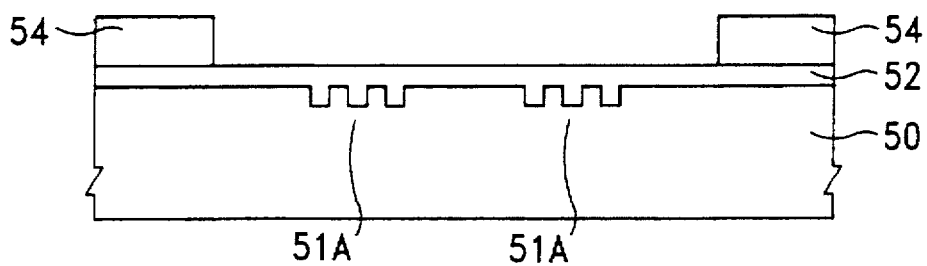

Next, patterning and etching the first dielectric layer 54 is performed. The first dielectric layer 54 is masked by a patterned photoresist layer 55 to define a WCW area, indicated by the arrow 51. The patterned photoresist layer is formed in the same photoresist step used to define contact holes in the ILD layer over the IC areas (not shown) of the wafer. Then an etching step is performed to remove portions of the first dielectric layer 54 not covered by the patterned photoresist layer 55, thereby forming the WCW area. This etching step is performed in the same etching step used to form the contact holes for the aforementioned IC areas of the wafer. The resulting structure is shown in FIG. 23.

Figure 24:
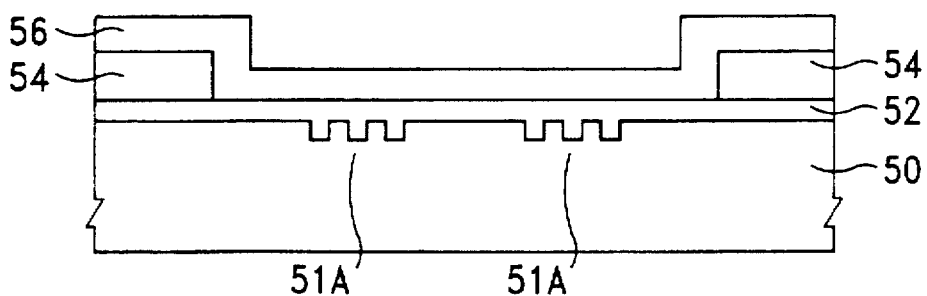

Referring to FIG. 24, a first metal layer 56 is formed on the first dielectric layer 34 and the polysilicon layer 52. In this embodiment, the first metal layer 56 is deposited by using a sputtering process, although any process suitable for the metal may be used. The first metal layer 56 can be any suitable material and has the thickness of a range of about 5000 to 10000 angstroms. In this embodiment, the first metal layer 56 is formed from 5000 to 1000 angstroms.

Figure 25:
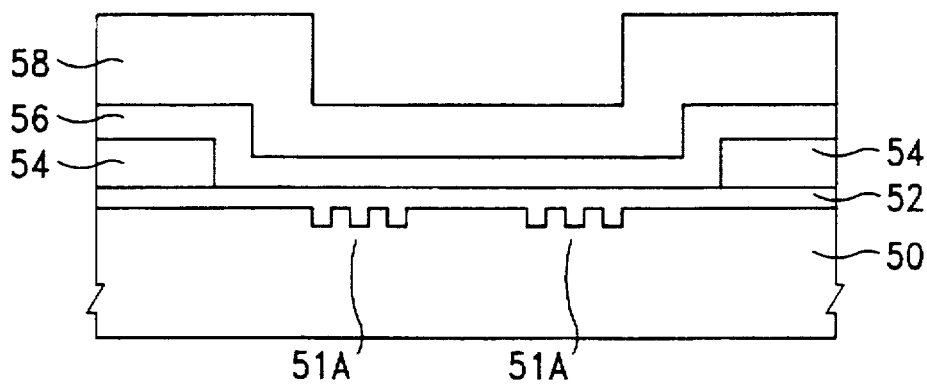
Figure 26:
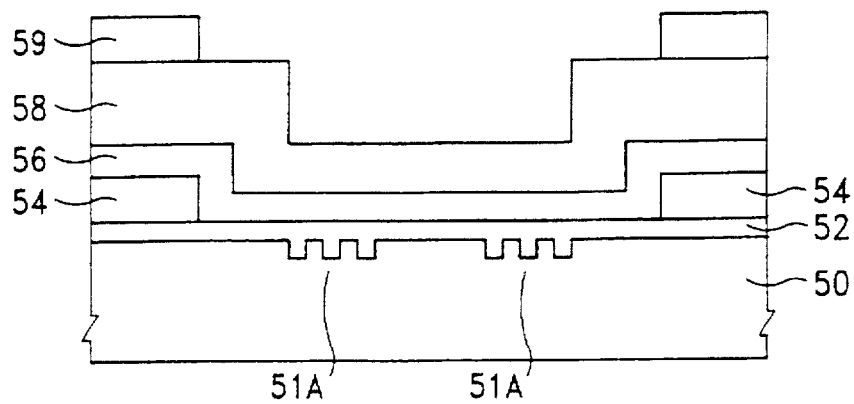

Then, a second dielectric layer 58 is formed on the first metal layer 56 as shown in FIG. 25. In this embodiment, the second dielectric layer 58 is an oxide layer, serving as an IMD layer. In this embodiment, the second dielectric layer 58 is deposited using a standard CVD process to a thickness of about 25000 angstroms. Turning to FIG. 26, a patterned photoresist layer 59 is formed on the second dielectric layer 58. In this embodiment, the patterned photoresist layer 59 is formed using a masking blade with the via mask for defining the vias (described below in conjunction with FIG. 29) in the IMD layer for the aforementioned IC areas of the wafer. The use of masking blades to use preselected portions of a mask is well known in the art of IC fabrication.

Figure 27:
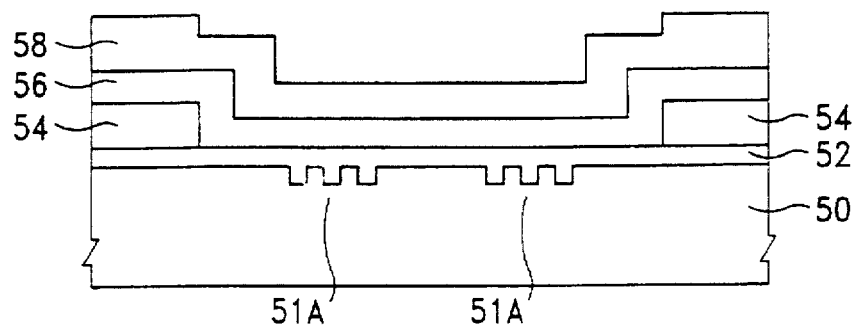

Then, an dry or wet etching step is performed to remove portions of the second dielectric layer 58 not covered by the patterned photoresist layer 59. In this embodiment, a wet etching process is used to isotropically etch the second dielectric layer 58. More specifically, a 10:1 buffered HF (BHF) dip process is used. Alternatively, a HF dip process or a standard dry etching may be used to isotropically etch the second dielectric layer 58. After this etching step, the second dielectric layer 58 has a thickness of about 25000 angstroms in the center portion of the WCW area. The photoresist layer 59 is then removed. The resulting structure is shown in FIG. 27. This isotropic etching step is used to partially remove oxide atop alignment mark in advance.

Figure 28:
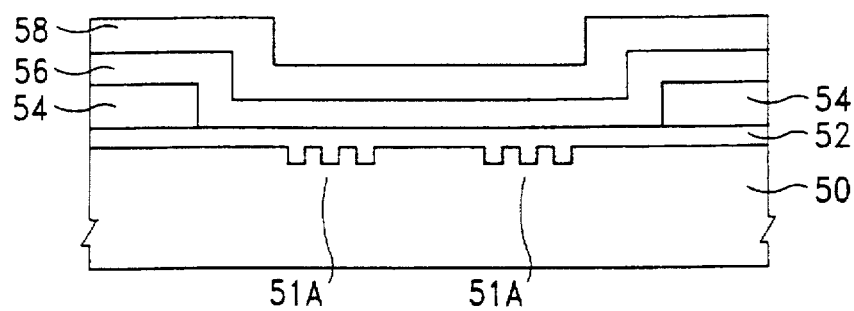
Figure 29:
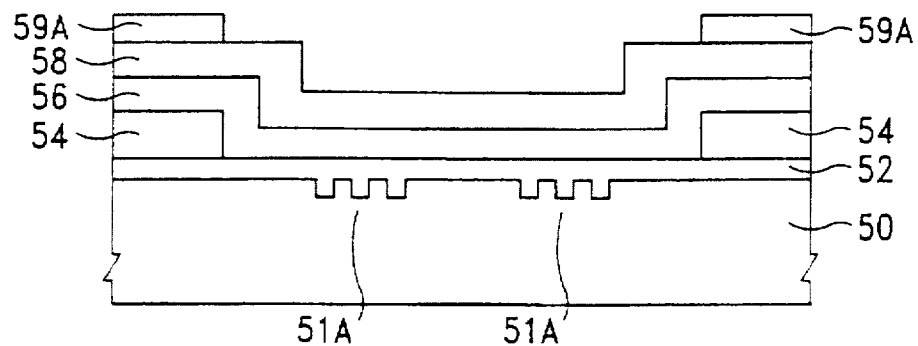
Figure 30:
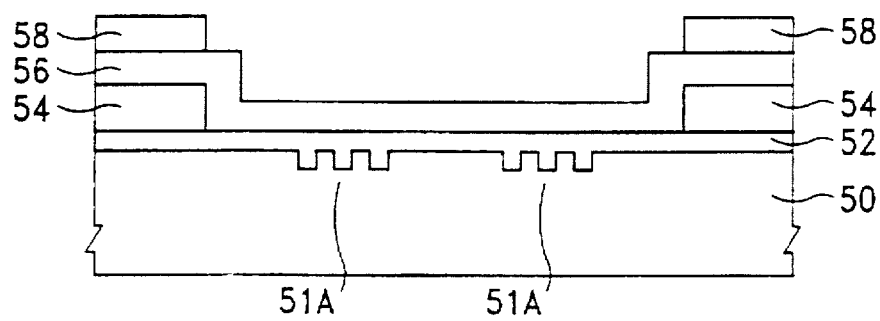

FIG. 28 shows a next stage of the method in which the second dielectric layer 58 is planarized. A CMP process is performed, planarizing the second dielectric layer 58 over the entire wafer. It will be appreciated that if the isotropic etch had not been performed as described above in conjunction with FIG. 27, this CMP process would result in alignment fail at subsequent metal photo. After the CMP process, the thickness of the second dielectric layer 58 in the center portion of the WCW area remains about 10000 angstroms. The thickness of the second dielectric layer over the first dielectric layer 54 is about 10000 angstroms after this CMP process. Next, a patterned photoresist layer 59A is formed on the second dielectric layer 58, as shown in FIG. 29. The patterned photoresist layer 59A is formed using a via mask for forming the vias in the first IMD layer over the aforementioned IC areas of the wafer. This via mask also defines the WCW area in the alignment mark area of the wafer. Then, an anisotropic etching step is performed to remove portions of the second dielectric layer 58 not covered by the patterned photoresist layer 59A, thereby exposing the portion of the first metal layer 56 within the WCW area 51 (FIG. 22) of the substrate 50. In this embodiment, a plasma etching process is used to etch the exposed portions of the second dielectric layer 58. The resulting structure is shown in FIG. 30.

Figure 31:
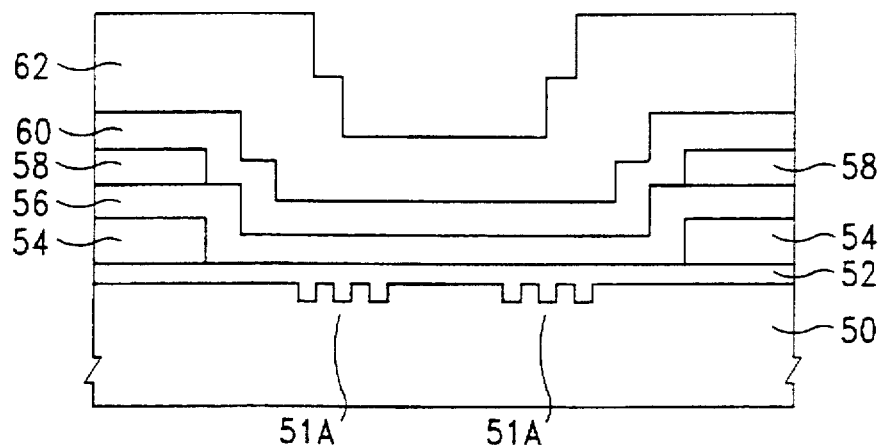

Turning to FIG. 31, a second metal layer 60 is formed on the second dielectric layer 58 and the first metal layer 56. In this embodiment, the second metal layer 60 is deposited by using a sputtering process to a thickness of about 5000 to 10000 angstroms. The second metal layer 60 can be formed from any suitable material. Then, a third dielectric layer 62 is formed on the second metal layer 60 to serve as a second IMD layer. In this embodiment, the third dielectric layer 62 is formed from oxide having a thickness of about 25000 angstroms using a standard CVD process. In other embodiments, the third dielectric layer 62 can be formed from any suitable dielectric material.

Figure 32:
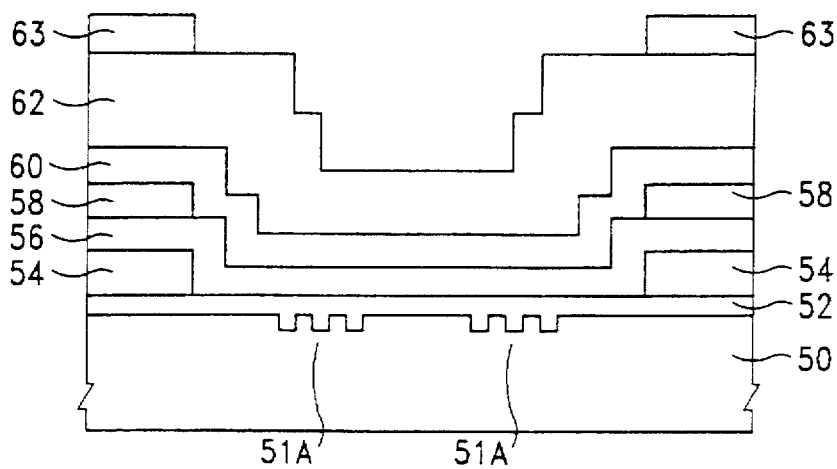

Next, a patterned photoresist layer 63 is formed on the third dielectric layer 62, as shown in FIG. 32. The patterned photoresist 63 is patterned by using a masking blade or a mask with WCW for defining the WCW on alignment marks in the second IMD layer for the aforementioned IC areas of the wafer. Alternatively, the masking blade may be used with the via mask for defining the vias in the first IMD layer described above in conjunction with FIG. 29.

Figure 33:
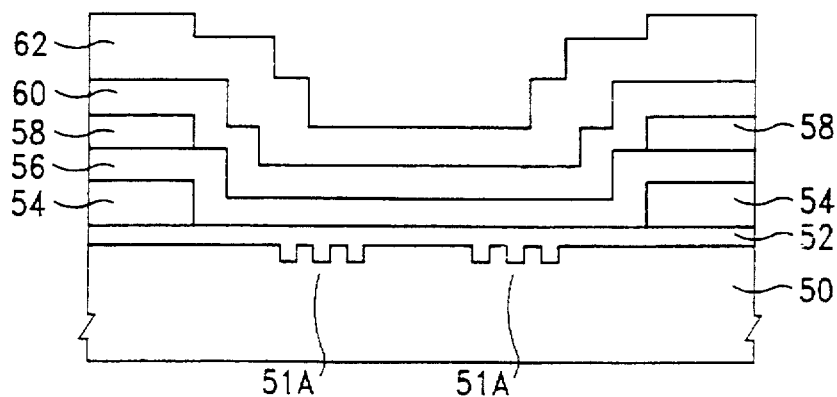
Figure 34:
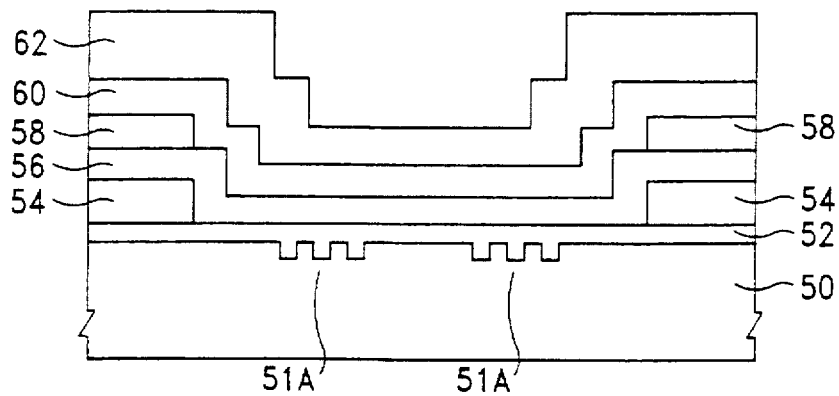

Then, an dry or wet etching step is performed to remove portions of the third dielectric layer 62 not covered by the patterned photoresist layer 63. In this embodiment, the same isotropic BHF wet etching process described above in conjunction with FIG. 28 is used to etch the third dielectric layer 62 to about half of its original thickness. Thus, in this embodiment, the third dielectric layer 62 has a thickness of 10000 angstroms in the center portion of the WCW area. Of course, in other embodiments, other suitable isotropic etching processes may be used (e.g., dry etching or other buffered oxide etches). The resulting structure is shown in FIG. 33. FIG. 34 shows a next stage of the method in which the third dielectric layer 62 is planarized to reduce the topography. In this embodiment, a CMP process is performed, planarizing the third dielectric layer 62 over the entire wafer. After the CMP process, the thickness of the third dielectric layer 62 in the center portion of the WCW area remains about 10000 angstroms.

Figure 35:
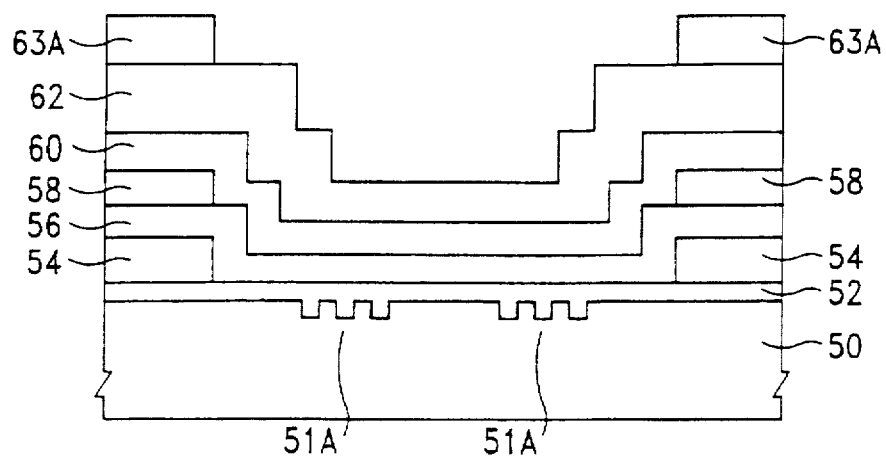
Figure 36:
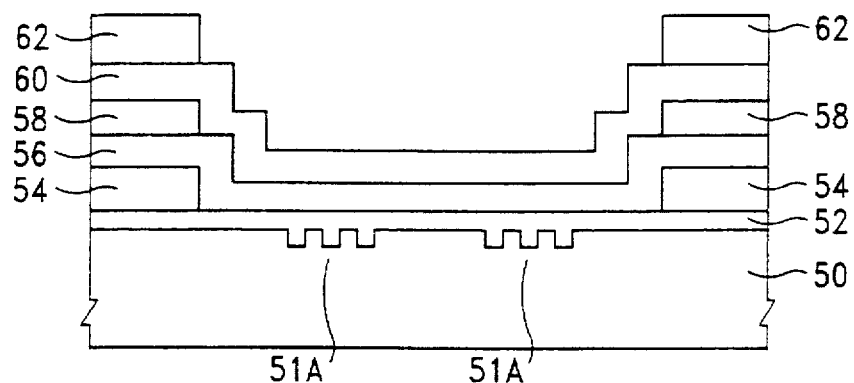

Next, a patterned photoresist layer 63A is formed on the third dielectric layer 62 to again define the WCW area, as shown in FIG. 35. The patterned photoresist layer 63A is patterned using the via mask defining the vias for the second IMD layer for the aforementioned IC areas of the wafer. Then, an etching step is performed to form the vias in the IC regions, and also removing the exposed portions of the third dielectric layer 62 in the WCW area. In this embodiment, a plasma etching process is used to etch the third dielectric layer 62, which exposes the portion of the second metal layer 60 in the WCW area. The resulting structure is shown in FIG. 36.

Figure 37:
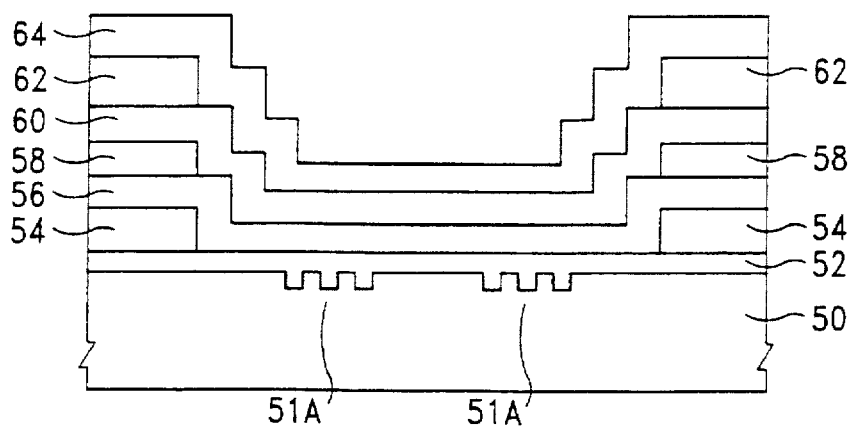

Finally, a third metal layer 64 is formed on the third dielectric layer 62 and the second metal layer 60 as shown in FIG. 37. In this embodiment, the third metal layer 64 is formed from sputter deposited TiN/AlCu or TiN/AlSiCu to a thickness of about 10000 angstroms. Then, the steps described above for processing the IMD layer (e.g., WCW photoresist, wet dip and CMP) can be repeated for each additional metal layer of the multi-metal layer IC. Although the cost of this invention process is higher than the cost of the aforementioned conventional methods, this method has several advantages. For example, no extra mask is needed. In addition, there is no alignment fail or alignment mark damage issue due to the CMP processing. Further, this method can be easily extended to a five-layer metal process and beyond. Still further, all of the conducting layer, including polysilicon and metal layers, remain on alignment mark for reducing the step height of WCW and non WCW areas.

Although specific embodiments including the preferred embodiment have been illustrated and described, the described embodiments are intended to be illustrative of the present invention rather than limiting. For example, deposition processes for forming the metal and dielectric layers other than those described may be used in other embodiments. Further, different buffering ratios for a BHF dip or different isotropic etching methods may be used. Accordingly, in light of the present disclosure, various modifications may be made to the describe embodiments by those skilled in the art of IC fabrication without departing from the spirit and scope of the present invention, which is intended to be limited solely by the appended claims.

The embodiments of the invention in which an exclusive property or privilege is claimed are defined as follows:

1. A method for protecting an alignment mark in semiconductor manufacturing processes with CMP, said method comprising:

forming a first dielectric layer on a substrate, wherein said substrate has alignment marks thereon;

planarizing said first dielectric layer;

patterning and etching said first dielectric layer to open a wide clear-out window encompassing said alignment marks;

forming a first metal layer on said first dielectric layer and said wide clear-out window;

forming a second dielectric layer on said first metal layer;

forming a photoresist layer on said second dielectric layer, said photoresist layer defining the wide clear-out window;

etching a portion of said second dielectric layer not covered by the photoresist layer;

planarizing said second dielectric layer;

removing a residual portion said second dielectric layer over said wide clear-out window, exposing a portion of said first metal layer over said wide clear-out window; and forming a second metal layer on said second dielectric layer and said exposed portion of said first metal layer over said wide clear-out window.

2. The method according to claim 1, wherein said first dielectric layer comprises an oxide layer.

3. The method according to claim 1, wherein said first dielectric layer serves as an interlayer dielectric layer.

4. The method according to claim 1, wherein said first dielectric layer has a thickness of about 7000 to 13000 angstroms.

5. The method according to claim 1, wherein a chemical mechanical polishing process is used to planarize said first dielectric layer.

6. The method according to claim 1, wherein etching said first and second dielectric layer comprises etching by using a dry etching process.

7. The method according to claim 1, wherein forming said first metal layer comprises depositing a conductive material by using a sputtering process.

8. The method according to claim 1, wherein said first and second metal layer has a thickness of about 4000 to 12000 angstroms.

9. The method according to claim 1, wherein said second dielectric layer comprises an oxide layer.

10. The method according to claim 1, wherein said second dielectric layer serves as an intermetal layer.

11. The method according to claim 1, wherein said second dielectric layer has a thickness of about 20000 to 30000 angstroms.

12. The method according to claim 1, wherein removing a portion of said second dielectric layer comprises etching by using a wet etching process.

13. The method according to claim 12, wherein said wet etching process comprises using a HF solution.

14. The method according to claim 13, wherein said HF solution comprises a buffered HF solution.

15. The method according to claim 1, wherein said second dielectric layer is planarized by using a chemical mechanical planarizing process.

16. The method according to claim 1, wherein removing said residual portion of said second dielectric layer comprises using a dry etching process.

17. The method according to claim 16, wherein said dry etching process comprises using a plasma etching process.

18. The method according to claim 1, wherein said second metal layer has a thickness of about 8000 to 16000 angstroms.

19. The method according to claim 1, wherein forming said second metal layer comprises depositing a conductive material using a sputtering process.

20. A method for protecting an alignment mark in semiconductor manufacturing processes with CMP, said method comprising:

forming a first dielectric layer on a substrate, wherein said substrate has alignment marks thereon;

planarizing said first dielectric layer;

patterning and etching said first dielectric layer to open a wide clear-out window encompassing said alignment marks;

forming a first metal layer on said first dielectric layer and said wide clear-out window;

forming a second dielectric layer on said first metal layer;

forming a first photoresist layer patterned to define said wide clear-our window;

removing a portion of said second dielectric layer not covered by said first photoresist layer;

planarizing said second dielectric layer;

patterning and etching said second dielectric layer in said wide clear-out window;

forming a second metal layer on said on said second dielectric layer and said wide clear-out window;

forming a third dielectric layer on said second metal layer;

forming a second photoresist layer patterned to define said wide clear-our window;

removing a portion of said third dielectric layer not covered by said second photoresist layer;

planarizing said third dielectric layer;

forming a third metal layer on said third dielectric layer and said wide clear-out window.

* * * * *